(12) United States Patent
Martin et al.

(10) Patent No.: US 7,056,134 B2
(45) Date of Patent: Jun. 6, 2006

(54) ATTACHABLE/DETACHABLE PROBING TIP SYSTEM FOR A MEASUREMENT PROBING SYSTEM

(75) Inventors: Jim L. Martin, Tigard, OR (US); Marc A. Gessford, Portland, OR (US); William R. Pooley, Aloha, OR (US); William Q. Law, Beaverton, OR (US); Ira G. Pollock, Hillsboro, OR (US); William A. Hagerup, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 53 days.

(21) Appl. No.: 10/856,230

(22) Filed: May 27, 2004

(65) Prior Publication Data

US 2005/0266733 A1 Dec. 1, 2005

(51) Int. Cl.
*G01R 31/02* (2006.01)

(52) U.S. Cl. .................. 439/169; 324/72.5; 439/77; 439/374; 439/357

(58) Field of Classification Search ............ 439/169, 439/357, 358, 374, 77, 354; 324/72.5, 149
See application file for complete search history.

(56) References Cited

U.S. PATENT DOCUMENTS

| 5,334,931 A | * | 8/1994 | Clarke et al. ............ 324/757 |
| 6,400,167 B1 | | 6/2002 | Gessford et al. |
| 6,466,000 B1 | | 10/2002 | Nightingale |
| 6,704,670 B1 | | 3/2004 | McTigue |

* cited by examiner

*Primary Examiner*—Neil Abrams
(74) *Attorney, Agent, or Firm*—William K. Bucher (57) ABSTRACT

A attachable/detachable probing tip system (10) has a housing (12) that includes a probing tip mounting member (14) and opposing substantially orthogonal attachment (16, 18) arms extending from the probing tip mounting member. The attachment arms define an inner surface of the probing tip mounting member in which is disposed at least a first a non-compressive set, resilient member (56). First and second probing tips (42, 44) are disposed over the non-compressive, resilient member (56) and secured to the housing by latching means (60, 66, 92, 96, 100, 130). The attachable/detachable probing tip system allows mounting of the probing tips (42, 44) to probing contacts on a device under test without a probe body or probing tip member (38) being attached. The attachment arms (16, 18) allows a probe body or probing tip member (38) to be attached and detached to the probing tip system (10). The probing tip member (38) includes contact pins that engage contact areas (82, 82, 92) of the probing tips (42, 44).

21 Claims, 6 Drawing Sheets

ATTACHABLE/DETACHABLE PROBING TIP SYSTEM FOR A MEASUREMENT PROBING SYSTEM

BACKGROUND OF THE INVENTION

The present invention generally relates to probing tips for measurement probes and more particularly to an attachable/detachable probing tip system for a measurement probing system where the probing tips of the probing tip system are mountable on a device under test separate from other components of the measurement probing system.

Voltage measurement probes acquire electrical signals from a device under test and couple the acquired signal to a measurement instrument, such as an oscilloscope or the like, via an electrical cable. A typical voltage probe has a probe head with an electrically conductive hollow tube having a substrate disposed therein. The substrate has passive or active circuitry for conditioning the acquired signal prior to being coupled to the measurement instrument. The end of the hollow tube has an insulating plug disposed therein with a coaxially disposed probing tip extending out of the plug in both directions. The portion of the probing tip extending into the hollow tube is electrically connected to the substrate. Generally, voltage measurement probes are used in hand-held probing of a device under test or mounted to a probing arm that is positioned on the device under test. Excessive force applied to the measurement probe can break the probing tip requiring replacement. Generally, this requires the measurement probe to be sent to a service center where experienced technicians take the probe apart and replace the broken tip. This results in the loss of use of the probe during the repair period and the expense of the repair.

U.S. Pat. No. 6,466,000 describes a replaceable probe tip holder and measurement probe head that allows a user to replace a broken probe tip without sending it to a service center. The replaceable probe tip holder has a cap and attachment arms extending away from the back end of the cap that are positionable on the outside of a probe head housing. The cap has a series of cavities from therein and a bore extending from the innermost cavity to the front end of the cap. A resilient compression member is positioned in the innermost cavity and a probing tip is passed through the resilient compression member and disposed in the bore with the probing point extending outward from the cap. The other end of the probing tip is flared out to form a head that sandwiches the resilient compression member between cap and the probing tip head. Adjacent to the innermost cavity is a second cavity that receives a portion of a substrate that is disposed in a probe head housing. The end face of the substrate has at least a first electrical contact that mates with the head of the probing tip. A third cavity receives a portion of the probe head housing. It should be noted that the probing tip is not securely mounted in the cap of the replaceable probing tip holder and that the probing tip is only securely mounted in the replaceable probe tip holder when the holder is positioned on the probe head.

As the bandwidth of measurement increases, there is a corresponding need for measurement probes having equal or greater bandwidths. A major difficulty in designing very wide bandwidth measurement probes having bandwidths of 5 GHz and greater is the effects of capacitance and inductance of the probing tip or tips. One solution to this problem is to separate the probing tips from the active circuitry in the probing head of the measurement probe. U.S. Pat. No. 6,704,670 describes a wideband active probing system where the probing tip or tips of the probe are separable from a probe amplifier unit. One or more probe cables are connected to a probe tip unit which are connected to the probe amplifier unit for conveying signals received by a probe unit. Various types of probe tip units may be connected to the probe amplifier unit. The probe tip unit may contain circuitry ranging from conductor traces to various resistive, capacitive, and/or other electronic elements. An advantage of such a probe design is that it allows the placement of the substantially smaller probe tip unit onto difficult to reach contacts on a device under test instead of a larger measurement probe containing probe amplifier circuitry.

The probe tip unit may be single ended or differential and includes probe connection points for electrically connecting probing tip units to the probe tip unit. The probing tip units include a probing tip and may include impedance elements, such as resistors. The probing tip units are secured to the probe connection points of the probe tip unit by soldering or compression terminal connections. Various types of probing tip units may be soldered to the probe connection points, such as solder-on, plug-on, SMT grabber, and wedge probe tip units. The various probing tip units allow for changing the electrical characteristics of the probing system or replacing a damaged probing tip unit by de-soldering the existing probing tip unit and soldering replacement probing tip units to the probe connection points. A drawback to this design is that each probing tip unit needs to be soldered to one of the probe connection points. In addition, continued soldering and de-soldering of the probing tip units to the probe connection points run the risk of damaging the probing contact point resulting in the loss of the probe tip unit. Further, in certain differential and single ended probing applications, the probe tip unit needs to be soldered to the probing points of the device under test. This may require a user to populate the device under test with multiple probe tip units which drives up the probing solution cost.

What is needed is an attachable/detachable probing tip system for a measurement probe system where the probing tips are easily mounted on a device under test without being connected to other components of the measurement probing system. The probing tip system needs to be inexpensive and easily attachable to the rest of the measurement probing system without the use of soldering.

SUMMARY OF THE INVENTION

Accordingly, the present invention is for an attachable/detachable probing tip system mountable on a device under test and attachable to a measurement probe. The probing tip system has a housing with a probing tip mounting member and opposing attachment arms extending in a substantially orthogonal direction from the probing tip mounting member. The attachment arms define an inner surface of the probing tip mounting member in which is disposed at least a first non-compressive set, resilient member. First and second probing tips are disposed over the compressive, resilient member and secured to the housing by latching means.

In a first embodiment of the invention, the first and second probing tips are electrical conductive wires extending from first and second resistive elements. The resistive elements are secured to the housing by the latching means which have first and second sets of notches formed in the inner surface of the probe tip mounting member. The notches of each respective set of notches are generally vertically aligned and separated by a recess formed in the inner surface of the probe tip mounting member that receives the non-compressive set, resilient member. One of the notches of each set of notches has a channel portion extending from the inner surface to a substantially circular portion. The other one of the notches of each set of notches has a bore therein extending to a front surface of the probing tip mounting member. An electrically conductive wire extending from the each of the first and second resistive elements in the opposite direction from the probing tip wire passes through the bores in the probing tip mounting member and is secured in the circular portions of the respective first and second sets of notches by passing through the channel portions of the notches. One of the notches of the first and second sets of notches extends from the top surface of the recess in the inner surface of the probe tip mounting member to the top surface of the probe tip mounting member. The other one of the notches of the first and second sets of notches extends from the bottom surface of the recess to a base portion.

In a further embodiment of the invention, the first and second probing tips are formed as part of a flexible substrate material having respective first and second probing tip arms defined by a notch formed in the flexible substrate material and at least first and second electrically conductive traces. One of the electrically conductive traces extends along one of the probing tip arms and the other electrically conductive trace extends along the other probing tip arm forming the first and second probing tips. The proximal ends of the first and second conductive traces form respective contact pads on the flexible substrate material that are disposed adjacent to and facing away from the non-compressive set, resilient member. The distal ends of the first and second conductive traces form contact pads on the respective first and second probing tip arms. Respective first and second resistive elements having opposing electrically conductive wires may have one of the electrically conductive wires electrically coupled to the contact pads on the first and second probing tip arms. The other conductive wires of each respective first and second resistive element form the respective first and second probing tips. Each of the conductive pads on the first and second probing tip arms may be formed with a electrically conductive aperture that receives one of the electrically conductive wires of the first and second resistive elements.

Alternately, the resistive elements and other passive electrical elements may be placed on the flexible substrate material and electrically coupled with the respective first and second conductive traces. The resistive and passive electrical elements may take the form of discrete components, printed resistors, capacitors or the like.

The flexible substrate material has an aperture formed therein and lateral extensions forming respective downward facing shoulders on the sides of the flexible substrate material. The aperture is positioned over a outwardly extending protrusion on the inner surface of the probing tip mounting member. Recesses are formed in the opposing attachment arms that extend downward from the top surface to form shouldered surfaces in the attachment arms that are adjacent to the probing tip mounting member. The recesses receive the lateral extensions of the flexible substrate member with the downward facing shoulders of the lateral extensions engaging the shouldered surfaces of the recesses. The combination of the flexible substrate material aperture engaging the protrusion on the inner surface of the probing tip mounting member and the lateral extensions of the flexible substrate material engaging the recesses in the extension arms latches the first and second probing tips to the housing.

The objects, advantages and novel features of the present invention are apparent from the following detailed description when read in conjunction with appended claims and attached drawings.

DETAILED DESCRIPTION OF THE PREFERRED EMBODIMENT

Figure 1:
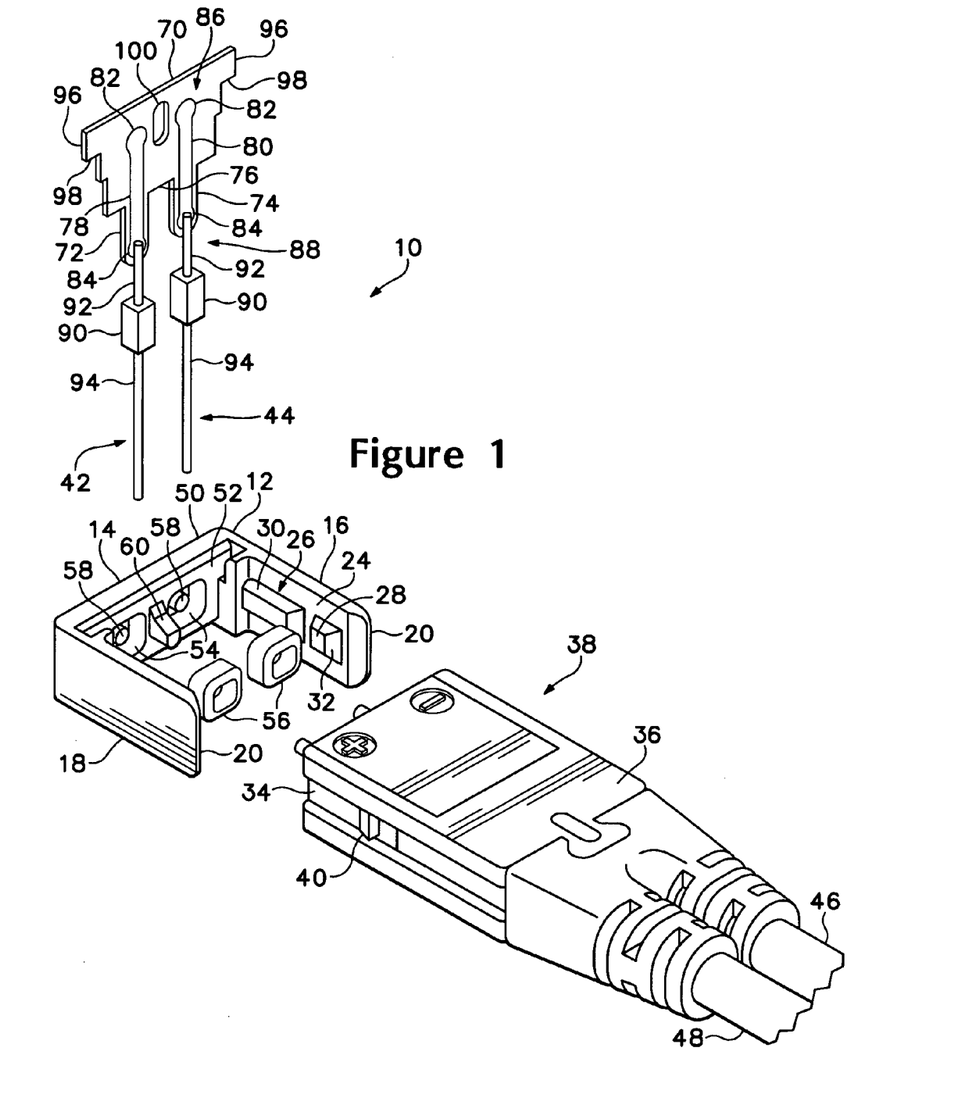
FIG. 1 is an exploded perspective view of a first embodiment of the attachable/detachable probing tip system according to the present invention.
Figure 2:
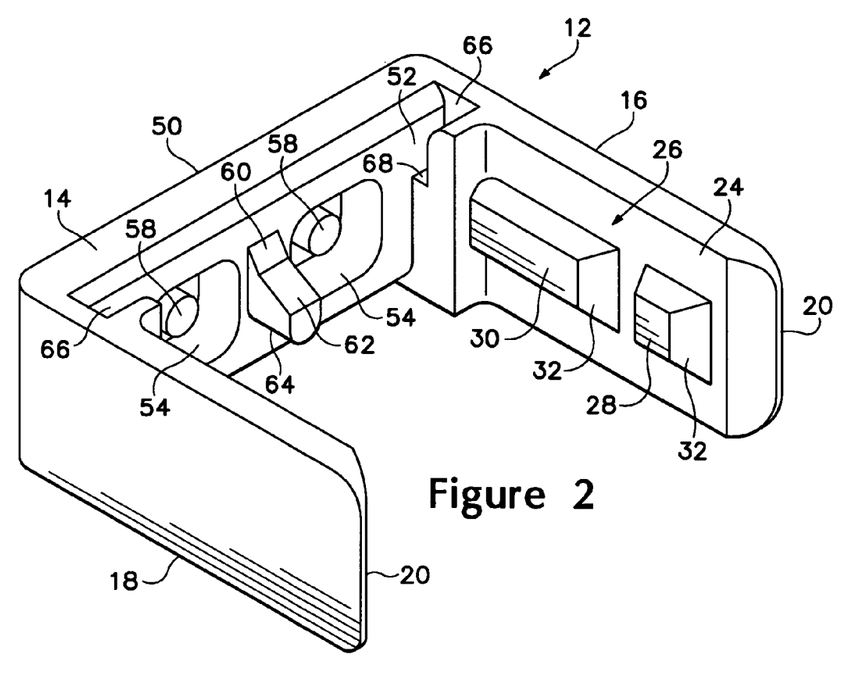
FIG. 2 is a perspective view of the housing of the first embodiment of the attachable/detachable probing tip system according to the present invention.

FIG. 1 is an exploded perspective view illustrating a first embodiment of the attachable/detachable probing tip system 10 of the present invention. The probing tip system 10 has a housing 12 having a probing tip mounting member 14 and substantially orthogonal attachment arms 16, 18 extending from the probing tip mounting member 14, as best seen in FIG. 2. The housing 12 is preferably formed a non-conductive, injection moldable material, such as ABS plastic, poly-carbonate, ABS-poly-carbonate blend, or the like. The distal ends of the attachment arms 16, 18 are formed with inwardly disposed bevels 20. The inner surface 24 of each of the attachment arms 16, 18 has a segmented rib 26 with each segment 28, 30 having a beveled rearward face 32. The segmented ribs 26 engage channels 34 on either side of a housing 36 of a probing tip member 38. Each channel 34 has a boss 40 formed in the channel that is captured between the segments 28, 30 of the segmented ribs 26 to secure the probing tip system 10 to the probing tip member 38. The probing tip member 38 includes a substrate disposed in the housing 36 that has circuitry mounted thereon for conditioning electrical signals coupled from a device under test to probing tip member 38 via first and second probing tips 42, 44 secured to the housing 12. Electrical contact pins extend from the front face of the probing tip member 38 that contact the probing tips 42, 44 of the probing tip system 10. The conditioned signals are coupled via coaxial cables 46, 48 to a probe body having additional circuitry for further conditioning of the acquired signals. The conditioned electrical signals in the probe head are coupled via a coaxial cable to a measurement instrument, such as an oscilloscope or the like. Alternately, the probing tip system 10 may secured directly to a probe body of a measurement probe. The probe body would have the channels 34 formed on the sides with the channels having the channel bosses 40 that are captured between the segments 28, 30 of the segmented ribs 26 on the attachment arms 16, 18.

The probe tip mounting member 14 has outer and inner surfaces 50, 52 with the inner surface 52 defined by the position of the attachment arms 16, 18 in relation to the probe tip mounting member 14. The inner surface 52 has apertures 54 formed therein that receive non-compressive set, resilient members 56. Preferably, the non-compressive set, resilient members 56 are made of an elastomeric material, such as a silicon material. Each aperture 54 are preferably formed with centrally disposed protrusion 58 that is received in a recess formed in the rearward surface of each of the non-compressive set, resilient members 56. The protrusions 58 and the recesses help hold the non-compressive set, resilient members 56 in the apertures 54.

The inner surface of the probing tip mounting member also has a outwardly extending protrusion 60 disposed between the apertures 54. The protrusion 60 has a beveled front face 62 and a bottom surface 64 defining a shouldered surface. The attachment arms 16, 18 have recesses 66 formed therein at the junction between the arms 16, 18 and the probing tip mounting member 14. The recesses 66 extend downward from the top surface of the attachment arms 16, 18 forming a shouldered surface 68 partway down the arms.

In a first implementation of the first and second probing tips 42, 44, a portion of the probing tips are formed on a flexible substrate material 70. In the preferred embodiment, the flexible substrate material 70 is a polyamide material, such as KAPTON®, manufactured and sold by E.I. DuPont De Nemours and Company, Wilmington, Del. The flexible conductive material 70 has first and second probing tip arms 72, 74 defined by a notch 76 between the probing tip arms. First and second electrically conductive traces 78, 80 are formed on the flexible substrate material 70 with one of the electrically conductive traces 78 extending along one of the probing tip arms 72 and the other electrically conductive trace 80 extending along the other probing tip arm 74. Electrical contact pads 82, 84 are formed on the respective proximal and distal ends 86, 88 of each of the electrically conductive traces 78, 80. In the preferred embodiment, a non-conductive material is disposed over the electrically conductive traces 78, 80 with the exception of the electrical contact pads 82, 84 to prevent the traces from shorting out circuitry on the device under test. Each of the electrical contact pads 82 on the distal ends 86 of the electrically conductive traces 78, 80 receive a resistive element 90 having opposing electrically conductive wires 92, 94. One of the wires 92 of each of the resistive elements 90 is electrically coupled to a respective electrical contact pad 84 of the first and second electrically conductive traces 78, 80 and the other wires 94 of the resistive elements 90 are employed as the probing tips 42, 44.

The flexible substrate material 70 is also formed with laterally extending protrusions 96 that from downwardly facing shoulder surfaces 98. An aperture 100 if formed in the flexible substrate material 70 between the proximal electrical contact pads 82 of the electrically conductive traces 78, 80. The size and shape of the aperture 100 conforms to the size and shape of the outwardly extending protrusion 60 on the inner surface 52 of the probing tip mounting member 14. The flexible substrate material 70 that includes the first and second probing tips 42, 44 is latched and secured into the housing 12 by insertion of the laterally extending protrusions 100 of the flexible substrate material 70 in the recesses 66 in the attachment arms 16, 18 and the insertion of the outwardly extending protrusion 60 on the inner surface 52 of the probing tip mounting member 14 into the aperture 100 in the flexible substrate material 70. The downwardly facing shoulder surfaces 98 of the laterally extending protrusions 96 engage the shouldered surfaces 68 of the recesses 66 with the aperture 100 engaging the shouldered surface 64 of the outwardly extending protrusion 60. The latching of the flexible substrate material 70 in the housing 12 positions the flexible substrate material 70 over the non-compressive set, resilient members 56 with the proximal electrical contact pads 82 of the electrically conductive traces 78, 80 facing away from the non-compressive set, resilient members 56.

Figure 3A:
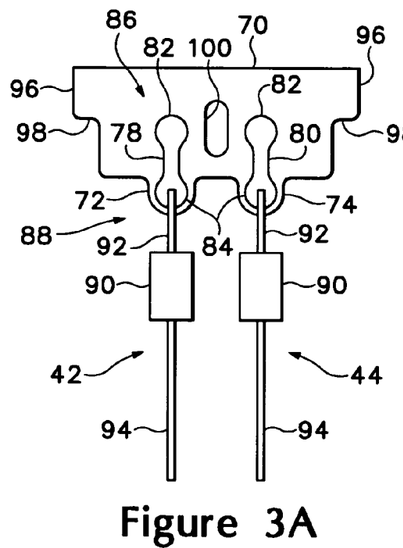
FIGS. 3A through 3F are plan views of various probing tips in the first embodiment of the attachable/detachable probing tip system according to the present invention.
Figure 3B:
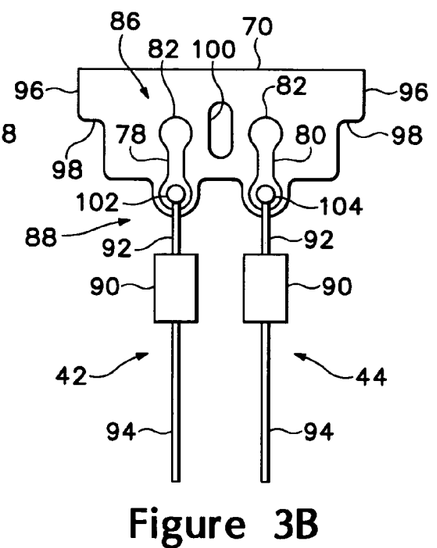
Figure 3C:
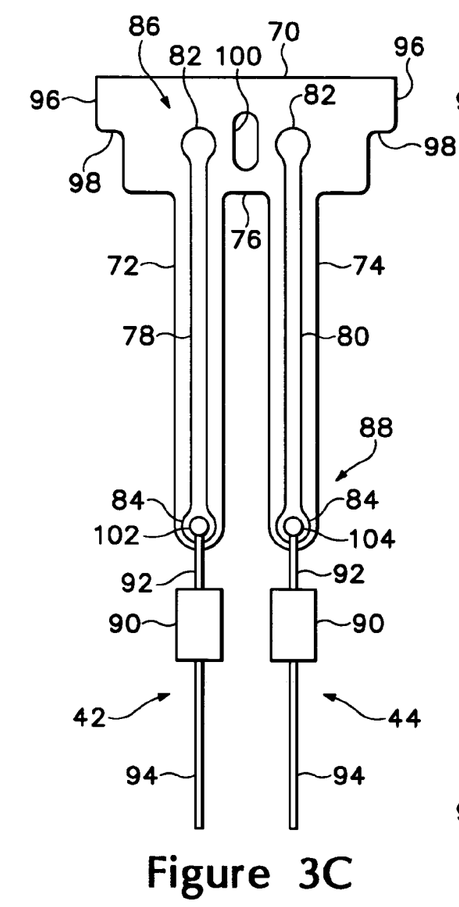

FIGS. 3A through 3E illustrate various implementations of the probing tips 42, 44 using the flexible substrate material 70. FIG. 3A shows very short probing tip arms 72, 74 with the one of the electrically conductive wires 92 of the resistive elements 90 secured to the distal electrical contact pads 84 of the electrically conductive traces 78, 80 by soldering or the like. The electrically conductive wires 92 of the resistive elements 90 connected to the electrical contact pads 84 are trimmed to position the resistive element 90 as close as possible to the electrical contact pads 84. The opposing electrically conductive wires 94 of the resistive element 90 act as the probing tips 42, 44 and may be trimmed to a desired length by the user. The separation of the probing tip arms 72, 74 as defined by the slot 76 between the arms may be varied to fit the specific needs of a user. Additionally, the lengths of the probing tip arms 72, 74 may be varied to fit a users need. In the commercial embodiment of the invention, the probing tip arms 72, 74 are 0.080, 0.2 and 1 inches long. The preferred resistive elements 90 used with the invention have electrically conductive wire 92, 94 having diameters of 0.008 and 0.020 inches. The probing tips 42, 44 in FIGS. 3B and 3C are shown with electrically conductive apertures 102, 104 formed in the distal electrical contact pads 84 of the electrically conductive traces 78, 80.

Figure 3D:
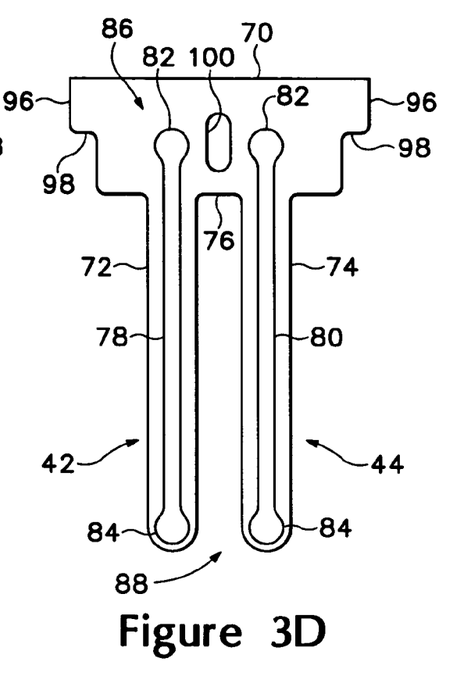
Figure 3E:
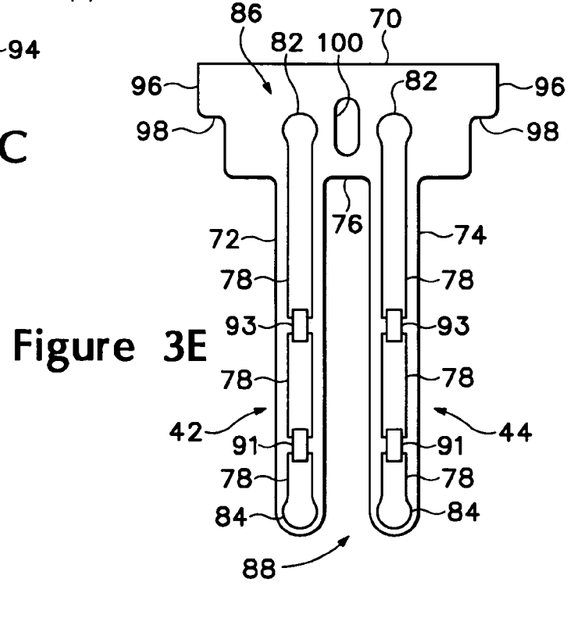

The electrically conductive apertures 102, 104 provide an opening through which the electrically conductive wires 92 of the resistive elements 90 may be inserted and soldered to the electrical conductive pads 84. FIG. 3D illustrates probing tips 42, 44 where the distal electrical contact pads 84 are the probing tips 42, 44. The electrical contact pads 84 are electrically connected to probing points on the device under test by soldering. FIG. 3E illustrates a further embodiment of the probing tips 42, 44 where passive electrical elements, such as resistive and capacitors elements 91, 93 are mounted on the probing tip arms 72,74 and connected by the electrically conductive traces 78, 80. The resistive and capacitive elements 91, 93 may form a portion of a compensated RC attenuator circuit. The resistive and capacitive elements 91, 93 may take the form a discrete components or printed-on devices using well known thick film processing methods. The resistive and capacitive elements 91, 93 may also be mounted in the probing tip arms 78, 80 in conjunction with the resistive elements 90 soldered to the electrical contact pads 84 on the probing tip arms.

Figures 3F, 4:
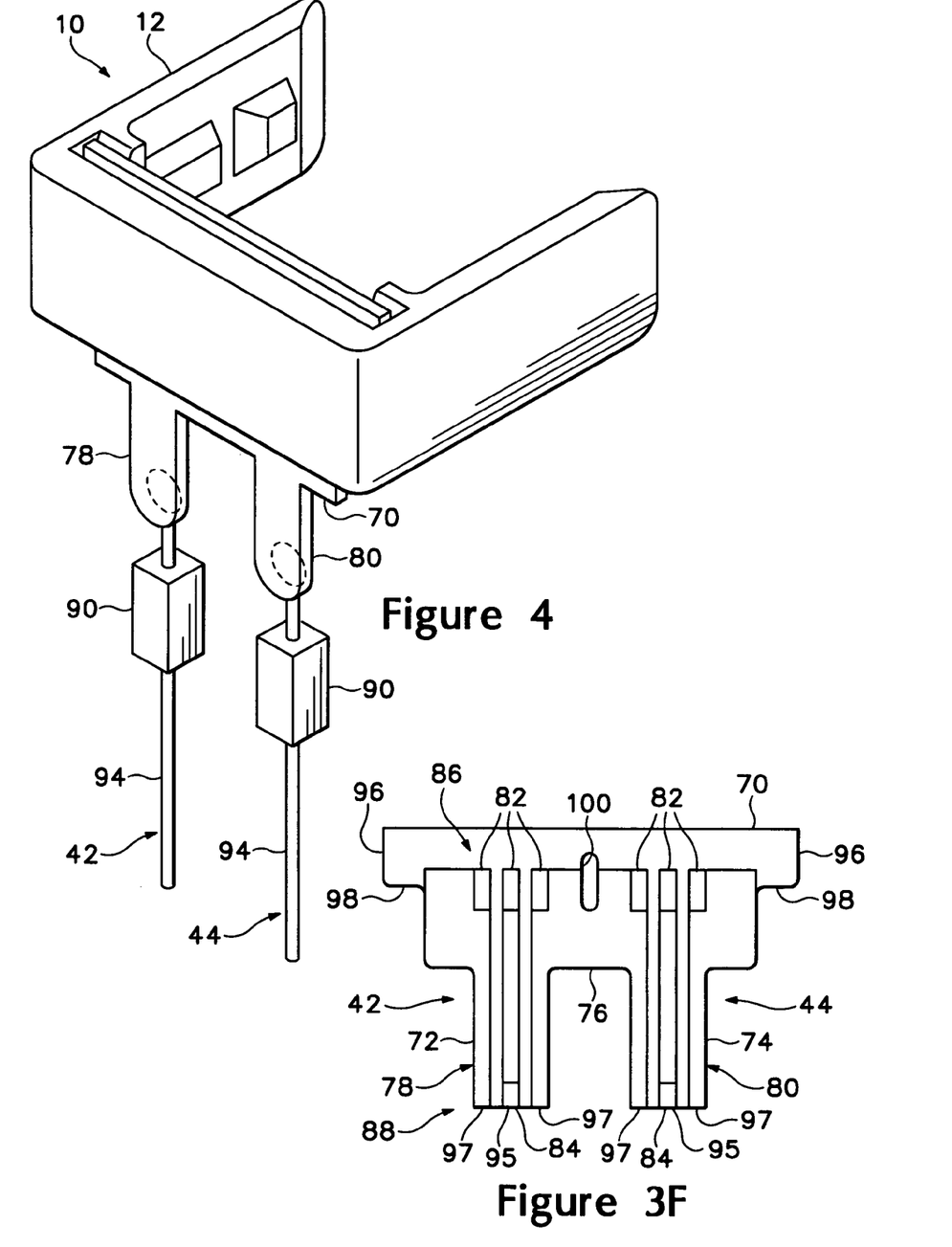
FIG. 4 is a perspective view of the assembled first embodiment of the attachable/detachable probing tip system according to the present invention.

FIG. 3F illustrates a further embodiment of the probing tips 42, 44. The electrically conductive traces 78, 80 are implemented as controlled impedance transmission lines. In the illustration of FIG. 3F, the controlled impedance transmission lines are implemented as coplanar waveguides having a signal conductor trace 95 and adjacent ground traces 97 disposed on either side of the signal conductor trace 95. Electrical contact pads 82 are formed on the proximal ends 86 of each of the signal and ground traces 95, 97 with the distal ends 88 of the signal traces 95 having electrical contact pads 84. As described with reference to FIG. 3E, passive electrical elements, such as resistive and capacitive elements may be mounted on the probing tip arms in electrical communications with the signal and ground traces 95, 97 to form a portion of a compensated RC attenuator circuit. The controlled impedance transmission line may also be formed as a microstrip transmission line where the ground trace lies below the signal trace.

FIG. 4 illustrates an example of an assembled attachable/detachable probing tip system 10. The flexible substrate material 70 is mounted in the housing 12 with the probing tip arms 78, 80 extending downward from the housing 12. Resistive elements 90 are soldered to the distal electrical contact pads 84 on the probing tip arms 78, 80 with the resistive element wires 94 acting as the probing tips.

Figure 5:
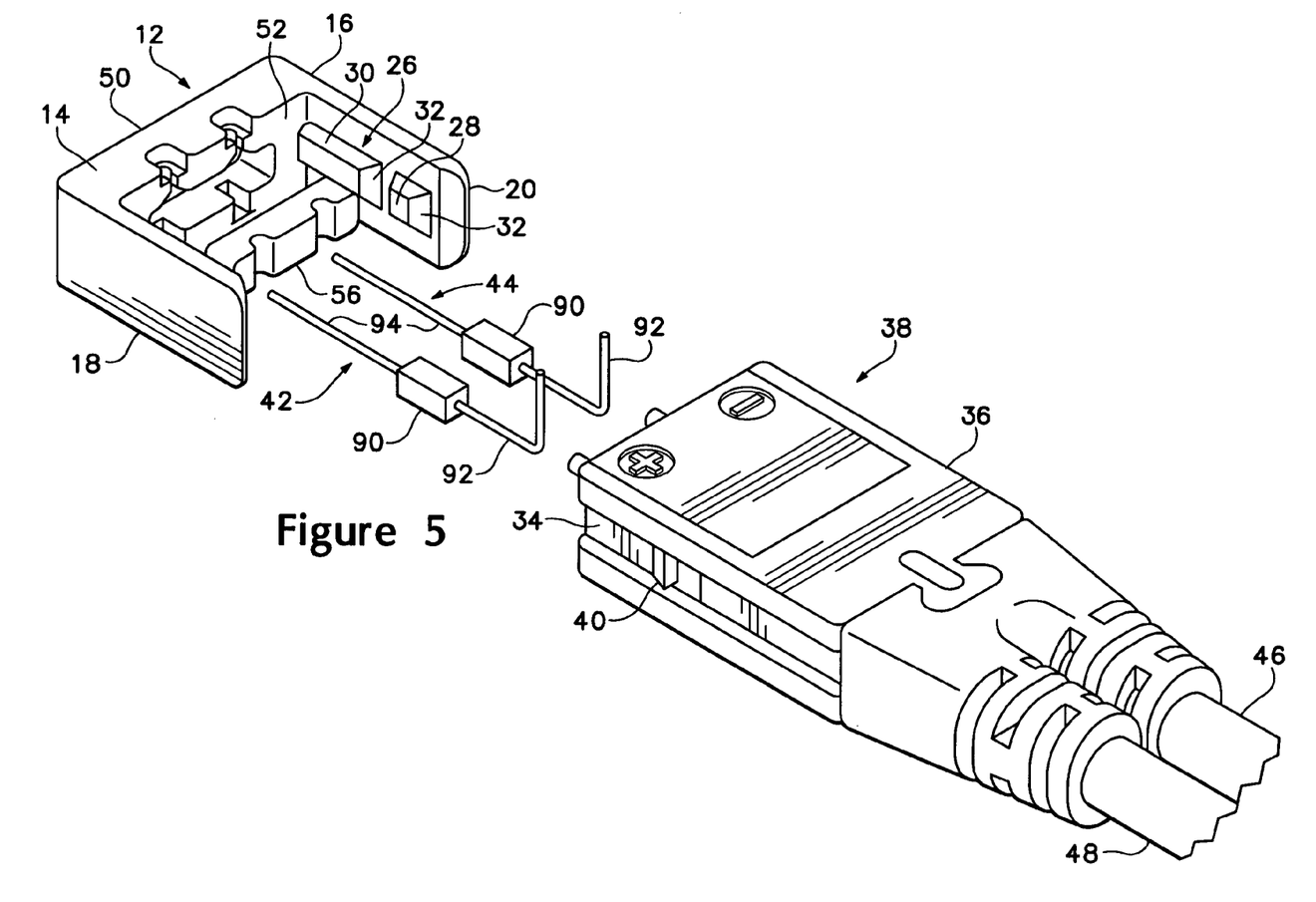
FIG. 5 is an exploded perspective view of a further embodiment of the attachable/detachable probing tip system according to the present invention.
Figure 6:
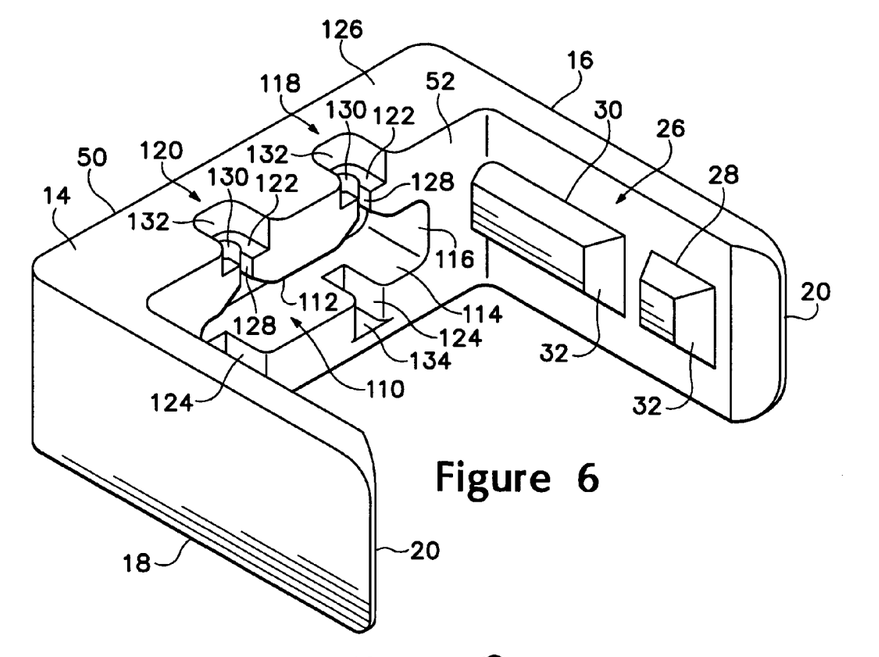
FIG. 6 is a perspective view of the housing of the further embodiment of the attachable/detachable probing tip system according to the present invention.
Figure 7:
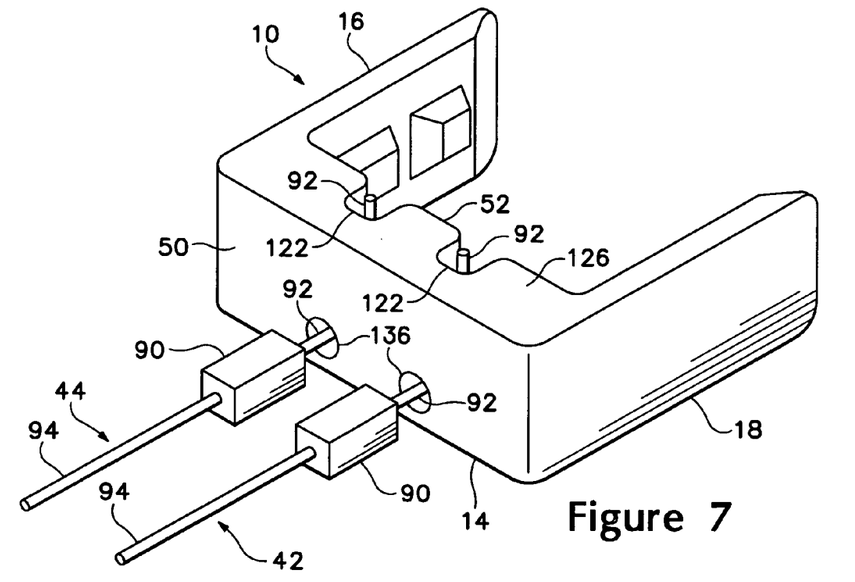
FIG. 7 is a perspective view of the assembled further embodiment of the attachable/detachable probing tip system according to the present invention.

Referring to FIG. 5, there is shown a further embodiment of the attachable/detachable probing tip system 10 of the present invention. Like elements from the previous drawings figures are labeled the same. In the embodiment of FIG. 5, the apertures formed in the inner surface of the probing tip mounting member is replaced with a substantially rectangular recess 110 having top 112, bottom 114 and side surfaces 116. Two sets of notches 118, 120 are formed in the inner surface 52 of the probing tip mounting member 14 with each set of notches having generally vertically positioned first and second notches 122, 124 as best shown in FIG. 6. The first notch 122 in each set of notches 118, 120 is disposed between the top surface 126 of the probing tip mounting member 14 and top surface 112 of the recess 110. The notch has a channel portion 128 extending from the inner surface to a substantially circular portion 130. A portion of the notch extending from the top surface of the probing tip mounting member 14 may have a U-shaped configuration 132 extending beyond the periphery of the channel 128 and circular 130 portions of the notch 122. The second notch 124 extends from the bottom surface 114 of the recess 110 to a position partway down the probing tip mounting member 14 to form a base surface 134. The second notch 124 has a generally U-shaped form. Bores 136 are formed in the probing tip mounting member 14 that extend from the second notches 124 to the front surface 50 of the probing tip mounting member 14 as best seen in FIG. 7.

Disposed within the recess 110 in the probing tip mounting member is a non-compressive set, resilient members 56. The non-compressive set resilient member 56 has a substantially rectangular shape that conforms to the recess 110 in the probing tip mounting member 14. The exposed surface 138 of the non-compressive set, resilient members 56 has notches 140 formed therein that are aligned with the notches 122, 124 formed in the inner surface 52 of the probing tip mounting member 14. One of the electrically conductive wires 94 of each of the resistive elements 90 passes through one of the respective bores 136 in the probing tip mounting member 14. The exposed electrically conductive wires 92 on the inner surface 52 side of the probing tip mounting member 14 are bent upward and passed through the channel portions 128 of the pair of first notches 122 and latched in the circular portion 130 with the electrically conductive wires 92 in contact with the non-compressive set resilient member 56. Any excess electrically conductive wire 92 is trimmed off at the top surface 126 of the probe tip mounting member 14. The notches 122, 124 align the respective electrically conductive wires 92 with the contact pins of the probing head member 38. The combination of the bores 136 and the notches 122, 124 in the probing tip mounting member 14 secures the resistive elements 90 in the probing tip system. The other electrically conductive wires 94 of the resistive elements 90 forms the probing tips 42, 44.

The attachable/detachable probing tip system 10 of the present invention provides an inexpensive solution for placing multiple probing tips 42, 44 of differing configurations on a device under test. The probing tips 42, 44 of multiple adapters 10 may be soldered to various probing points on the device under test. Each probing tip system 10 may then be attached in sequence to the measurement probe by sliding the attachment arms 16, 18 along the channels 34 in the probing head member 38 or the probe body until the channel bosses 40 are captured between the segments 28, 30 of the attachment arm ribs 26. The probing tip system 10 is detached from the measurement probe by leveraging the attachment arm ribs 26 past the channel bosses 40 using the beveled end surfaces 20 of the attachment arms 16, 18. If the probing tips 42, 44 of one of the probing tip systems 10 is damaged it is easily replaced with another probing tip system 10 without having to sent the measurement probe in for servicing.

An attachable/detachable probing tip system 10 has been described having a housing 12 in which probing tips 42, 44 are secured. The housing 12 has attachment arms 16, 18 that connect the probing tip system 10 to a measurement probe. The housing 12 also has a probing tip mounting member 14 that receives a non-compressive resilient member 56. Different types of probing tips 42, 44 are secured to the housing 12 via a latching means. The probing tips 42, 44 may include a flexible substrate material 70 having electrically conductive traces 72, 74 formed thereon as the probing tips 42, 44. Resistive elements 90 may also be electrically coupled to the electrically conductive traces 72, 74 with the electrically conductive wires 94 of the resistive elements 90 being the probing tips 42, 44. The probing tips 42, 44 may also be just the electrically conductive wires 94 of the resistive elements 90.

It will be obvious to those having skill in the art that many changes may be made to the details of the above-described embodiments of this invention without departing from the underlying principles thereof. The scope of the present invention should, therefore, be determined only by the following claims.

What is claimed is:

1. An attachable/detachable probing tip system for a measurement probe mountable on a device under test comprising:
    a housing having a probing tip mounting member and opposing substantially orthogonal attachment arms extending from the probing tip mounting member with the extending attachment arms defining an inner surface of the probing tip mounting member;
    at least a first non-compressive set, resilient member disposed in the inner surface of the probing tip mounting member;
    first and second probing tips with each respective first and second probing tip having a resistive element disposed between electrically conductive wires extending in opposing directions from the resistive element with one of the electrically conductive wires disposed over the non-compressive set, resilient member; and
    latching means for securing the first and second probing tips to the housing.

2. The attachable/detachable probing tip system as recited in claim 1 wherein the non-compressive set, resilient member comprises a non-conductive elastomer.

3. The attachable/detachable probing tip system as recited in claim 2 wherein the non-conductive elastomer comprises silicon.

4. The attachable/detachable probing tip system as recited in claim 1 wherein the first and second probing tips comprise respective first and second resistive elements having electrically conductive wires extending in opposing directions from the resistive elements.

5. The attachable/detachable probing tip system as recited in claim 4 wherein the latching means comprises first and second sets of notches formed in the inner surface of the probe tip mounting member with the notches of each respective set of notches being generally vertically aligned and separated by a recess receiving the non-compressive set, resilient member with one of the notches of each set of notches has a channel portion extending from the inner surface to a substantially circular portion and the other of the notches of each set of notches having bores therein extending to a front surface of the probing tip mounting member such that one of the electrically conductive wires of each of the first and second resistive elements passes through the bores in the probing tip mounting member and is secured in the circular portions of the respective first and second sets of notches by passing through the channel portions of the notches.

6. The attachable/detachable probing tip system as recited in claim 5 wherein the probe tip mounting member has top, bottom and front surfaces and the recess has top and bottom surfaces wherein one of the notches of the first and second sets of notches extends from the top surface of the recess in the inner surface of the probe tip mounting member to the top surface of the probe tip mounting member and the other of the notches of the first and second sets of notches extends from the bottom surface of the recess to a base portion.

7. An attachable/detachable probing tip system for a measurement probe mountable on a device under test comprising:
    a housing having a probing tip mounting member and opposing substantially orthogonal attachment arms extending from the probing tip mounting member with the extending attachment arms defining an inner surface of the probing tip mounting member;
    at least a first non-compressive set, resilient member disposed in the inner surface of the probing tip mounting member;
    first and second probing tips disposed over the compressive, resilient member with the first and second probing tips formed of a flexible substrate material having respective first and second probing tip arms defined by a notch formed in the flexible substrate material and at least first and second electrically conductive traces, with one of the electrically conductive traces extending along one of the probing tip arms and the other electrically conductive trace extending along the other probing tip arm forming the first and second probing tips with the proximal ends of the first and second electrically conductive traces forming respective electrical contact pads on the flexible substrate material that are disposed adjacent to and facing away from the non-compressive set, resilient member and the distal ends of the first and second conductive traces forming electrical contact pads on the respective first and second probing tip arms; and
    latching means for securing the first and second probing tips to the housing.

8. The attachable/detachable probing tip system as recited in claim 7 wherein each of the first and second electrically conductive traces further comprises passive electrical elements disposed on the flexible substrate and electrically coupled with the respective first and second conductive traces.

9. The attachable/detachable probing tip system as recited in claim 8 wherein the passive electrical elements comprise discrete surface mounted resistive elements.

10. The attachable/detachable probing tip system as recited in claim 8 wherein the passive electrical elements comprise printed resistive elements formed on the flexible substrate.

11. The attachable/detachable probing tip system as recited in claim 8 wherein the passive electrical elements comprise discrete surface mounted resistive and capacitive elements.

12. The attachable/detachable probing tip system as recited in claim 8 wherein the passive electrical elements comprise printed resistive and capacitive elements formed on the flexible substrate.

13. The attachable/detachable probing tip system as recited in claim 8 wherein the first and second probing tips further comprise respective first and second resistive elements having opposing electrically conductive wire with one of the electrically conductive wires of each respective first and second resistive element electrically coupled to the respective electrical contact pads on the distal ends of the first and second electrically conductive traces and the other of the electrically conductive wires of each respective first and second resistive element forming the respective first and second probing tips.

14. The attachable/detachable probing tip system as recited in claim 13 further comprising electrically conductive apertures formed in the respective electrical contact pads of the first and second probing arms for receiving one of the electrically conductive wires extending from respective first and second resistive elements.

15. The attachable/detachable probing tip system as recited in claim 7 wherein the electrical conductive traces on each of the probing tip arms of the flexible substrate material further comprises a controlled impedance transmission line.

16. The attachable/detachable probing tip system as recited in claim 15 wherein the controlled impedance transmission line further comprises a coplanar waveguide having a signal conductor trace and adjacent ground traces disposed on either side of the signal conductor trace.

17. The attachable/detachable probing tip system as recited in claim 16 wherein each of the signal and ground traces of each coplanar waveguide is coupled to a corresponding electrical contact pad disposed on the electrical contact pad portion of the flexible substrate.

18. The attachable/detachable probing tip system as recited in claim 15 wherein the controlled impedance transmission line further comprises a microstrip waveguide having a signal conductor trace on one surface of the flexible substrate a ground trace disposed below the signal conductor trace on the opposite surface of the flexible substrate.

19. The attachable/detachable probing tip system as recited in claim 18 wherein each of the signal and ground traces of each microstrip waveguide is coupled to a corresponding electrical contact pad disposed on the electrical contact pad portion of the flexible substrate.

20. The attachable/detachable probing tip system as recited in claim 8 further comprising first and second recesses formed in the inner surface of the probing tip mounting member receiving first and second non-compressive set, resilient members.

21. The attachable/detachable probing tip system as recited in claim 8 wherein the attachment arms have a top surface and the latching means comprises:
   an aperture formed in the flexible substrate material and lateral extensions forming respective downward facing shoulders on the sides of the flexible substrate material; and
   an outwardly extending protrusion on the inner surface of the probing tip mounting member having a shouldered surface and recesses formed in the opposing attachment arms that extend downward from the top surface to form shouldered surfaces in the attachment arms that are adjacent to the probing tip mounting member wherein the outwardly extending protrusion receives the aperture in the flexible substrate material and the recesses receive the lateral extensions of the flexible substrate member with the downward facing shoulders of the lateral extensions engaging the shouldered surfaces of the recesses.

* * * * *